(12) United States Patent
Yeh et al.

(10) Patent No.: US 7,115,449 B2
(45) Date of Patent: Oct. 3, 2006

(54) METHOD FOR FABRICATION OF POLYCRYSTALLINE SILICON THIN FILM TRANSISTORS

(75) Inventors: Ching-Fa Yeh, Hsinchu (TW); Tien-Fu Chen, Hsinchu (TW); Jen-Chung Lou, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 115 days.

(21) Appl. No.: 10/867,660

(22) Filed: Jun. 16, 2004

(65) Prior Publication Data

US 2004/0266074 A1    Dec. 30, 2004

Related U.S. Application Data

(63) Continuation-in-part of application No. 10/601,701, filed on Jun. 24, 2003.

(51) Int. Cl.
*H01L 21/00* (2006.01)
(52) U.S. Cl. ........................ 438/149; 438/166
(58) Field of Classification Search ................ 438/149, 438/151, 487, 166, 706
See application file for complete search history.

(56) References Cited

U.S. PATENT DOCUMENTS

| | | | | |
|---|---|---|---|---|
| 4,330,363 A | | 5/1982 | Biegesen | 156/620 |
| 4,583,281 A | * | 4/1986 | Ghezzo et al. | 438/439 |
| 4,592,799 A | | 6/1986 | Hayafuji | 156/617 |
| 5,021,119 A | | 6/1991 | Fan | 156/620.71 |
| 5,395,481 A | | 3/1995 | McCarthy | 156/630 |
| 5,457,067 A | * | 10/1995 | Han | 438/442 |
| 5,589,406 A | * | 12/1996 | Kato et al. | 438/164 |
| 6,100,119 A | * | 8/2000 | Jang et al. | 438/151 |
| 6,495,405 B1 | | 12/2002 | Voutsas | 438/166 |
| 6,686,647 B1 | * | 2/2004 | Kimura et al. | 257/604 |
| 2004/0026738 A1 | * | 2/2004 | Hasegawa | 257/347 |

OTHER PUBLICATIONS

Ching-Wei Lin et al.; "High-Performance Low-Temperature Poly-Si TFTs Crystallized By Excimer Laser Irradiation With Recessed-Channel Structure"; IEEE Electron Devices Lett.; vol. 22; pp. 269-271; 2001.
G.K. Giust et al.; Performance Improvement Obtained For Thin-Film Transistors Fabricated In Prepatterned Laser-Recrystallized Polysilicon:; IEEE Electron Devices Lett.; vol. 18; pp. 296-298; 1997.
G.K. Giust et al.; "Comparison Of Excimer Laser Recrystallized Prepatterned and Unpatterned Silicon Films on $SiO_2$,"; J. Appl. Phys. 81; pp. 1204-1211; 1997.
Yasuyuki Sano et al.; "High-Performance Single-Crystalline-Silicon TFTs on a Non-Alkali Glass Substrate"; in Tech. Dig. IEDM; 2002.

* cited by examiner

*Primary Examiner*—Michael Lebentritt
*Assistant Examiner*—Stanetta Isaac
(74) *Attorney, Agent, or Firm*—Troxell Law Office, PLLC

(57) ABSTRACT

The present invention provides a method for fabrication of polycrystalline silicon thin film transistors, which forms a silicon spacer on the sidewall of the active layer of a thin film transistor (TFT) by way of anisotropic plasma etching in a single direction. The silicon spacer provides a mechanism for laser recrystallization on the sidewall to prevent the active layer from shrinkage or shelling-off after the laser recrystallization. According to the present invention, large grains can be formed in the channel without additional mask during production. By doing so, the characteristics of the components are enhanced; the uniformity is improved; and, the production cost is lowered. Therefore, this technique will play an important role in the fields of low temperature polycrystalline silicon thin film transistor (LTPS-TFT).

8 Claims, 7 Drawing Sheets

METHOD FOR FABRICATION OF POLYCRYSTALLINE SILICON THIN FILM TRANSISTORS

RELATED APPLICATION

This application is a Continuation-In-Part of application Ser. No. 10/601,701, filed on Jun. 24, 2003 and currently pending.

FIELD OF THE INVENTION

The present invention relates to a method for fabrication of polycrystalline silicon thin film transistors. More particularly, the present invention relates to obtaining large silicon grains in the channel of the transistor without any additional mask so to enhance the characteristics, to improve the uniformity, and to lower the production cost.

BACKGROUND OF THE INVENTION

As the price of the conventional a-Si (amorphous silicon) TFT (thin film transistor) LCD (liquid crystal display) keeps going down and the applications of the LTPS-TFT (low temperature polycrystalline silicon thin film transistor) in small-size display is extending day by day, the LTPS-TFT has gained its market share in mobile terminal devices, such as personal digital assistant, digital camera, cell phone, etc., because of its advantage on resolution, brightness, size and electromagnetic disturbance.

However, on producing the LTPS-TFT by laser annealing, the active layer of the transistor is formed after the laser recrystallization of the a-Si film, so that the resulting silicon grain structure would be limited in size owing to the thickness of the film. And the silicon grains with irregular sizes are spread in the active layer of the transistor, which causes the differences in the electric properties of the components and so diminishes the uniformity. But, on the contrary, if the active layer of transistor is formed 'before' the laser recrystallization of the a-Si film, a surface tension induced shrinkage would happen on the active layer owing to the melting of the whole silicon film. Therefore, the conventional method can not be used in fabricating LTPS-TFTs.

In addition, the structure of the components, like TFT and silicon-on-insulator metal oxide semiconductor field effect transistor (SOI-MOSFET), would comprise an insulated layer with poor thermo conductivity under active layer. When the working current of the device is large, the temperature of the active layer would suddenly rise and the mobility of the carrier in the active layer would be diminished. So, a related technique suggests that the bigger channel W can be divided into a plurality of smaller channels $W_i$ connected in a parallel way to overcome the self-heating effect. As shown in FIG. 7, it is a view showing the way to overcome the self-heating effect according to the prior art.

SUMMARY OF THE INVENTION

The main purpose of the present invention is to provide a high mobility for the field effect carrier of the LTPS-TFT and to diminish the differences among components. On fabricating the transistors according to the present invention, if the channel width is smaller but the silicon grain in the channel is larger, the transistors that produce driving pixels can conspicuously enhance the resolution of the display. Moreover, the process window for laser recrystallization becomes wider and the electrical properties of the LTPS-TFT are enhanced. In the mean time, the differences among components are diminished, the uniformity among them is improved and the product yield is increased.

The other purpose of this invention is to obtain a mechanism that the melting of the silicon and the lateral recrystallization is triggered after the annealing of a continuous-wave (CW) laser or an excimer laser. Such a mechanism can greatly improve the mobility of the field effect carrier to enhance the characteristics of the components without additional mask during the production. In addition, the thick silicon spacer can guarantee the active layer against shrinkage after laser irradiation. If the active layer in dog-bone shape is scanned by a high-energy CW laser in a source-drain direction, a single silicon grain can be obtained in the channel of the transistor which can be further used to produce LTPS-TFT with high performance and good uniformity. On obtaining components with bigger channel width W according to the present invention, various current requirements can be met by parallel connections of several channels with smaller width $W_i$ so that bigger silicon grain can still be kept in the channel and the self-heating effect can be solved at the same time.

To achieve the above purposes, the present invention is a method for fabrication of polycrystalline silicon thin film transistors, comprising the following steps.

a) Provide a substrate.

b) Form a buffer oxide on the substrate.

c) Deposit an amorphous silicon on the buffer oxide;

d) Deposit a low-temperature oxide on the amorphous silicon. For the subsequent production procedure, the oxide is to be a stop layer for anisotropic plasma etching on the silicon film, a thermal insulating layer for laser annealing, and a hard mask for removing the silicon spacer after recrystallization.

Using a photoresist as a hard mask, the low-temperature oxide is totally etched by way of anisotropic plasma etching and then the amorphous silicon underneath is partially etched.

f) After the removal of the photoresist, deposit another amorphous silicon where the amorphous silicon underneath is now connected with the active layer. Form a silicon spacer on the sidewall of the active layer by way of anisotropic plasma etching. Then, recrystallize the amorphous silicon by a CW laser or an excimer laser to obtain larger silicon grain on the active layer. At the end, by way of anisotropic plasma etching, totally remove the silicon spacer and the low-temperature oxide on the active layer.

BRIEF DESCRIPTION OF THE DRAWINGS

The present invention will be better understood from the following detailed description of preferred embodiments of the invention, taken in conjunction with the accompanying drawings, in which.

DESCRIPTION OF THE PREFERRED EMBODIMENTS

Figure 1:
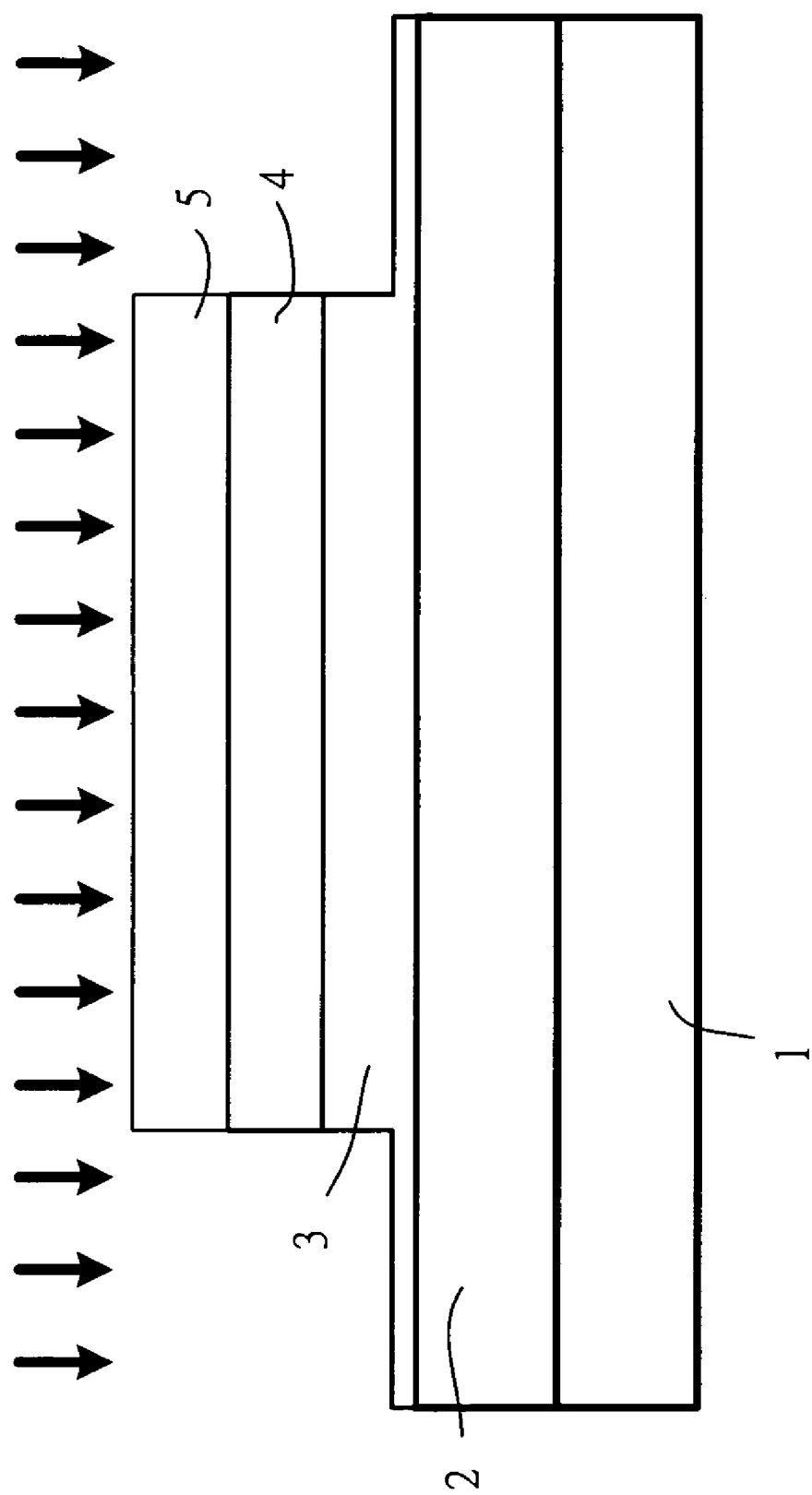
FIG. 1, FIG. 2 and FIG. 3 are cross-sectional views showing the forming process in vertical current direction according to the present invention.
Figure 2:
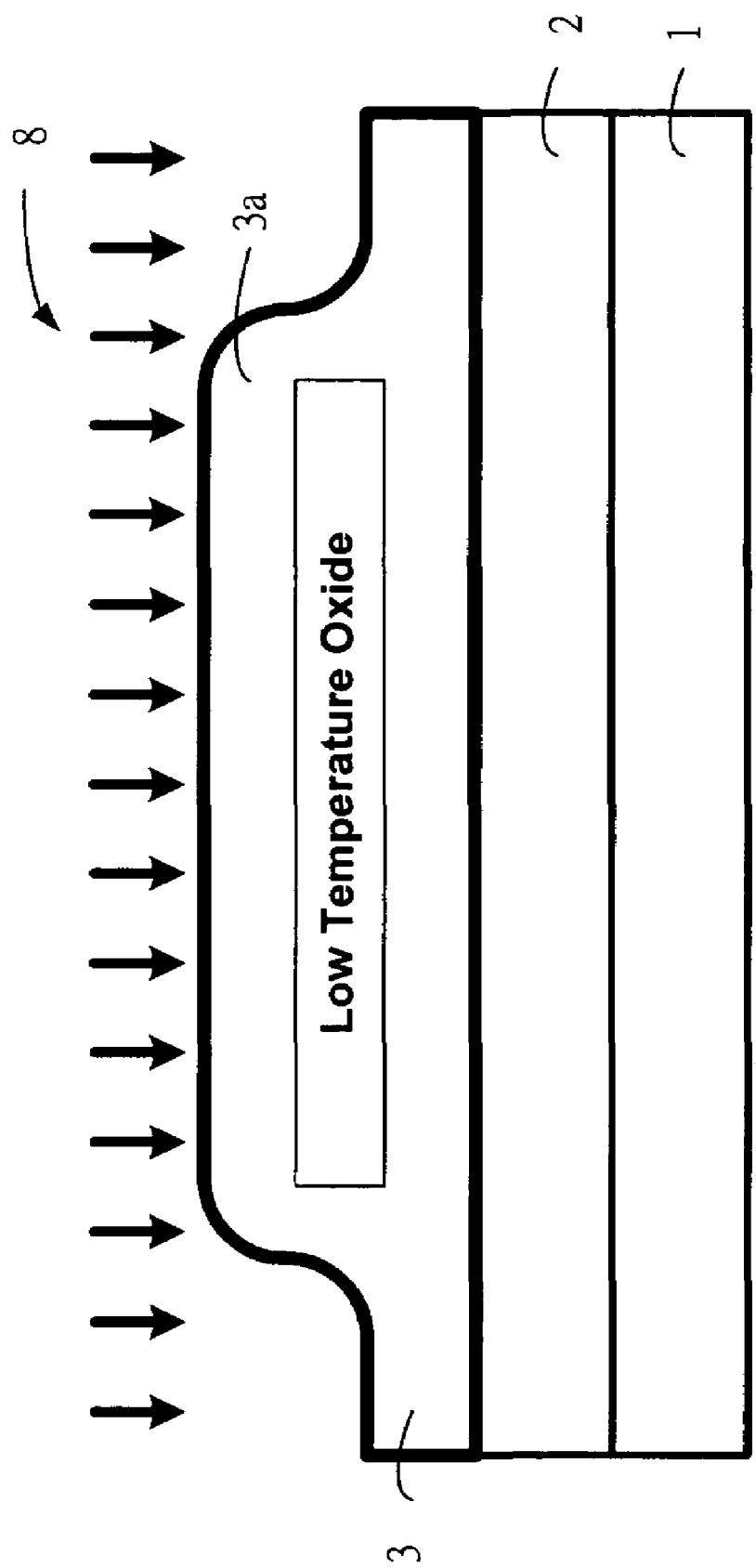

The following descriptions of the preferred embodiment are provided to understand the features and the structures of the present invention.

Please refer to FIG. 1 to FIG. 7, which are cross-sectional views showing the forming process in vertical current direction according to the present invention; a vertical view showing the relative positions of the drain, the source, and the gate in the transistor according to the present invention; a SEM (scanning electron microscope) view according to the present invention; a view showing the positions of the graphs on the active layer and the scan direction of the recrystallization done by a continuous-wave (CW) laser according to the present invention; and a view showing the way to overcome the self-heating effect of the transistor with bigger channel width according to the prior art. As shown in the figures, the present invention is a method for fabrication of polycrystalline silicon thin film transistors, comprising the following steps.

a) Provide a substrate 1.

b) Form a buffer oxide 2 on the substrate 1.

c) Deposit an amorphous silicon 3 on the buffer oxide 2;

d) Deposit a low-temperature oxide 4 on the amorphous silicon 3, wherein the oxide 4 is to be used as a stop layer for anisotropic plasma etching on the silicon film amorphous silicon 3, a thermal insulating layer for laser annealing, and a hard mask for removing the silicon spacer after recrystallization.

e) By using a photoresist 5 as a hard mask, the low-temperature oxide 4 is totally etched by way of anisotropic plasma etching 8 and the amorphous silicon 3 underneath is partially etched.

f) After the removal of the photoresist 5, deposit another amorphous silicon 3a, wherein the amorphous silicon 3 underneath the amorphous silicon 3a is now connected with the newly deposited amorphous silicon 3a. Form a silicon spacer 7 (shown in FIG. 3) on the sidewall of the active layer by way of anisotropic plasma etching 8. Then, recrystallize the amorphous silicon 3 by a CW laser or an excimer laser to obtain a larger silicon grain on the active layer. At the end, remove the silicon spacer and the low-temperature oxide on the active layer by way of the anisotropic plasma etching 8.

The above silicon spacer comprises a spacer formed of polycrystalline silicon or amorphous silicon. And the silicon spacer in step f comprises the sidewall of the active layer of SOI-MOSFET (silicon-on-insulator metal oxide semiconductor field effect transistor) used on TFT (thin film transistor) and SOI (silicon-on-insulator), no matter in the production procedure with high or low temperature. In step f, laser recrystallization is processed after forming the silicon spacer TFT on the rim of the active layer, wherein the silicon spacer is to obtain a temperature gradient for recrystallization on the sides of the silicon film amorphous silicon 3. The silicon spacer covered on the sidewall of the active layer of TFT can be replaced with dielectric material (such as oxide, nitride, metal oxide, etc.) or metal material (such as aluminum, wolfram, molybdenum, chromium, etc.).

Then, the silicon spacer can optionally be removed (or just be left) for the next process. Or, in step f, the active layer can firstly be recrystallized by excimer laser annealing (ELA), solid phase crystallization (SPC), or metal-induced lateral crystallization (MILC), and, then, a silicon spacer is formed on the rim of the active layer of TFT or SOI-MOSFET.

Figure 3:
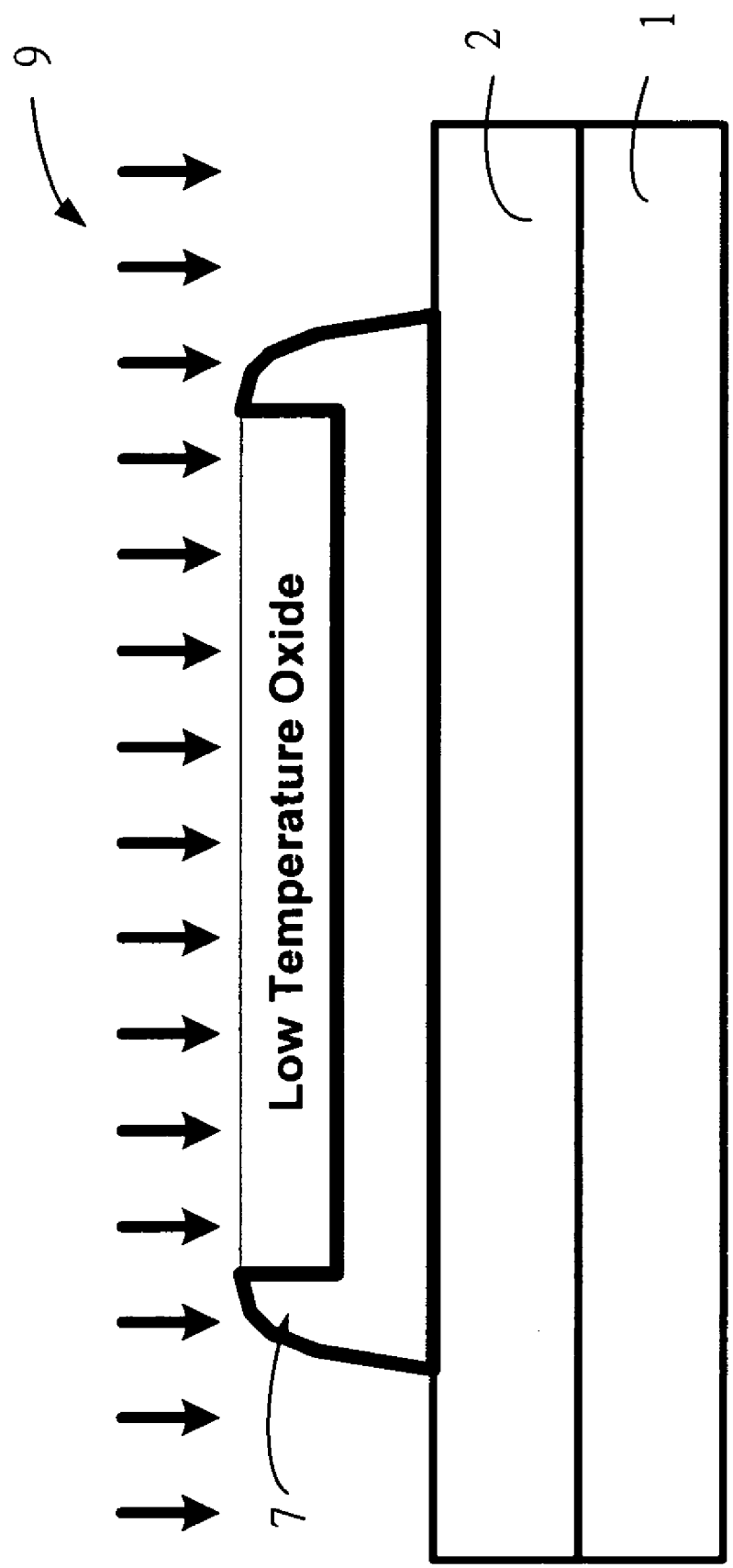

After the silicon spacer 7 is formed on the rim of the active layer of the amorphous silicon 3, the active layer in dog-bone shape can be recrystallized with a high-energy CW laser or an excimer laser 9, during which a temperature gradient can be obtained on the active layer to enlarge the silicon grain (as shown in FIG. 3).

Figure 4:
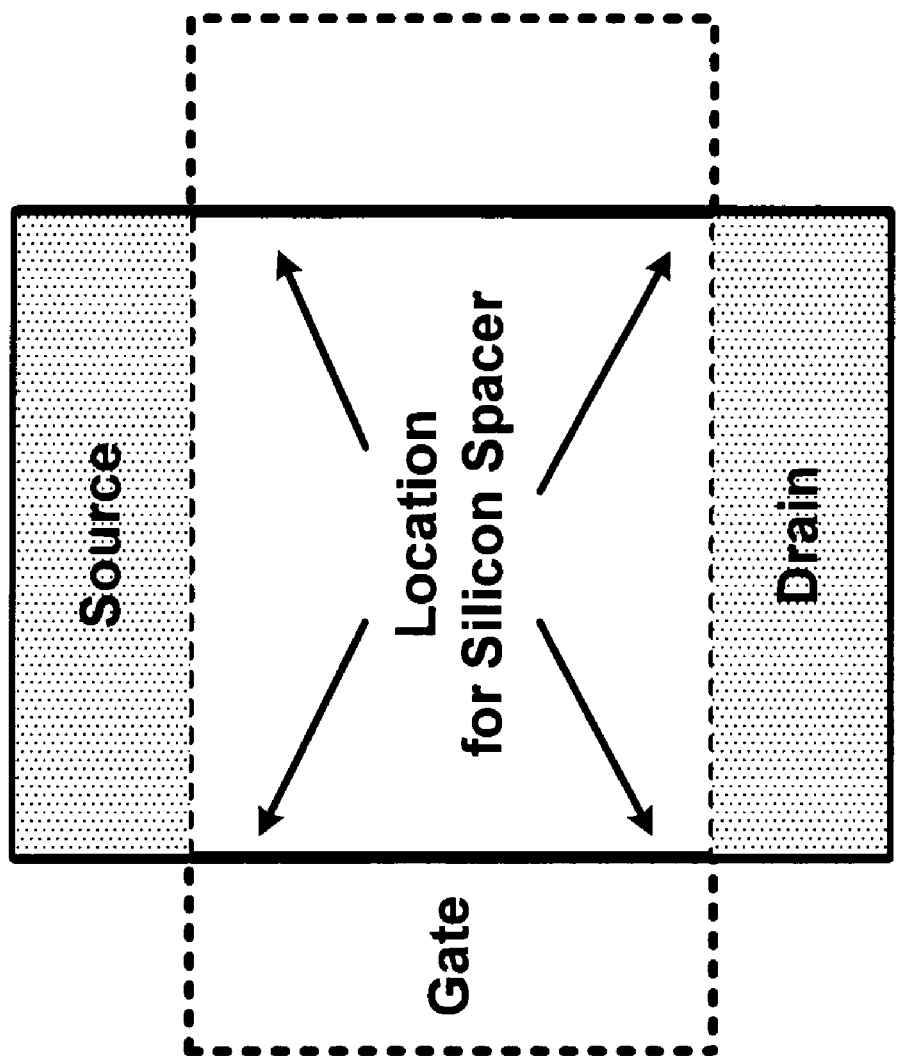
FIG. 4 is a vertical view showing the relative positions of the drain, the source, and the gate in the transistor according to the present invention.

Please refer to FIG. 4, which shows the relative position of the gate 10, the source 11, and the drain 12. As is shown, the silicon spacer will surround the whole active layer (amorphous silicon film 3) before the laser recrystallization. If the silicon spacer 7 is not totally removed by the subsequent anisotropic plasma etching 8, the remaining silicon spacer 7 will not affect the electrical property of the transistor because of the crystallization of the silicon spacer 7. The voltage and current will be affected by the silicon spacer 7.

Figure 5:
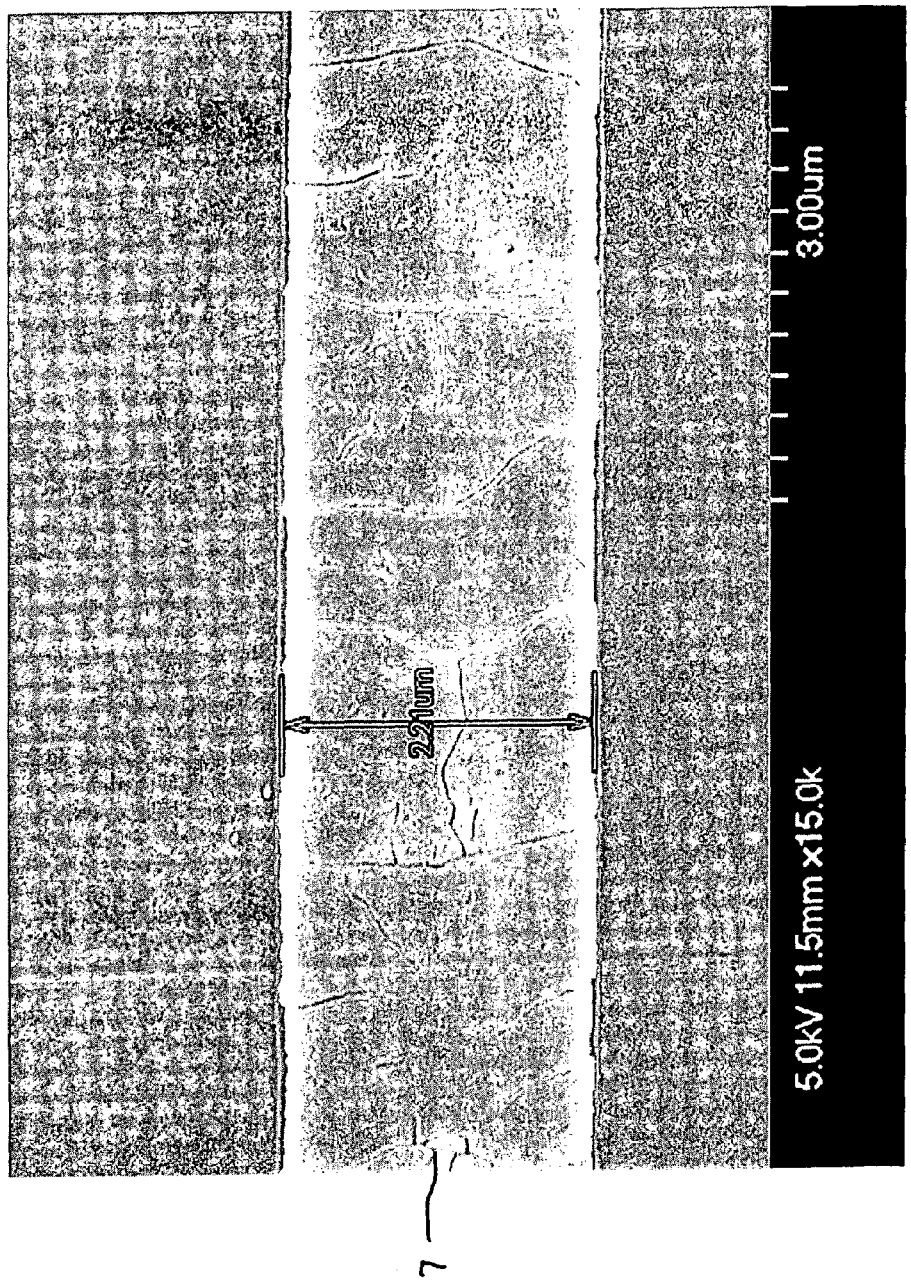
FIG. 5 is a SEM (scanning electron microscope) view according to the present invention.
Figure 6:
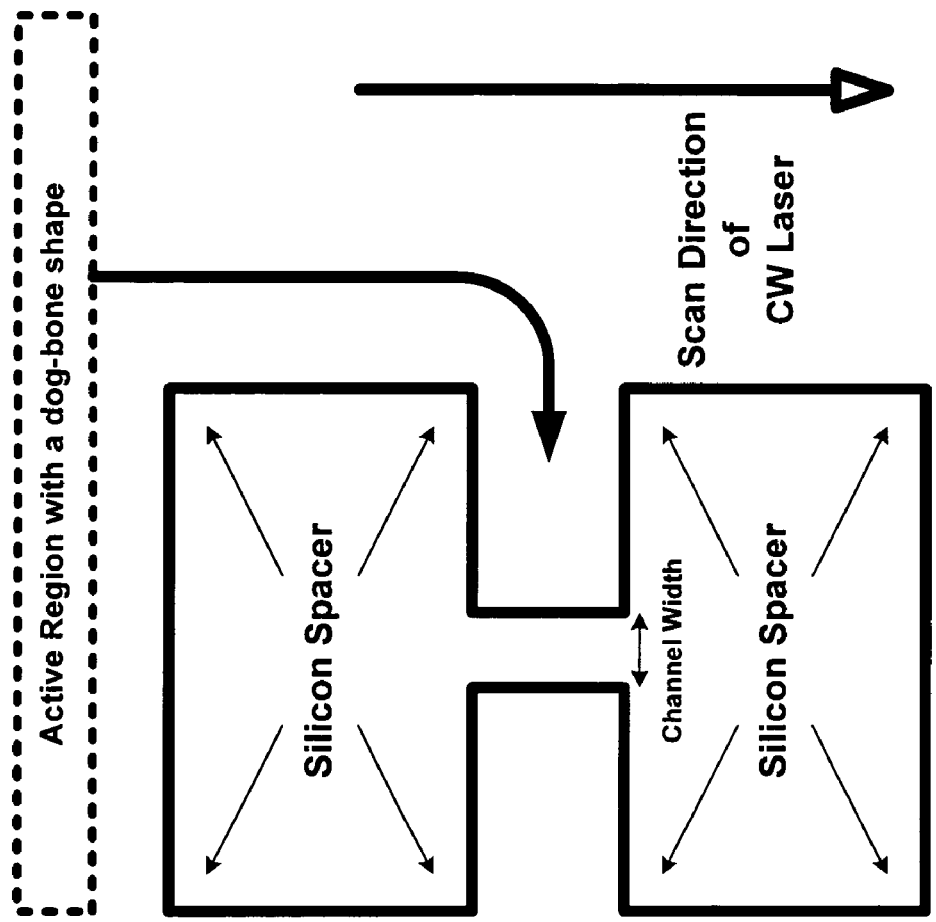
FIG. 6 is a view showing the positions of the graphs on the active layer and the scan direction of the recrystallization done by a continuous-wave laser according to the present invention.
Figure 7:
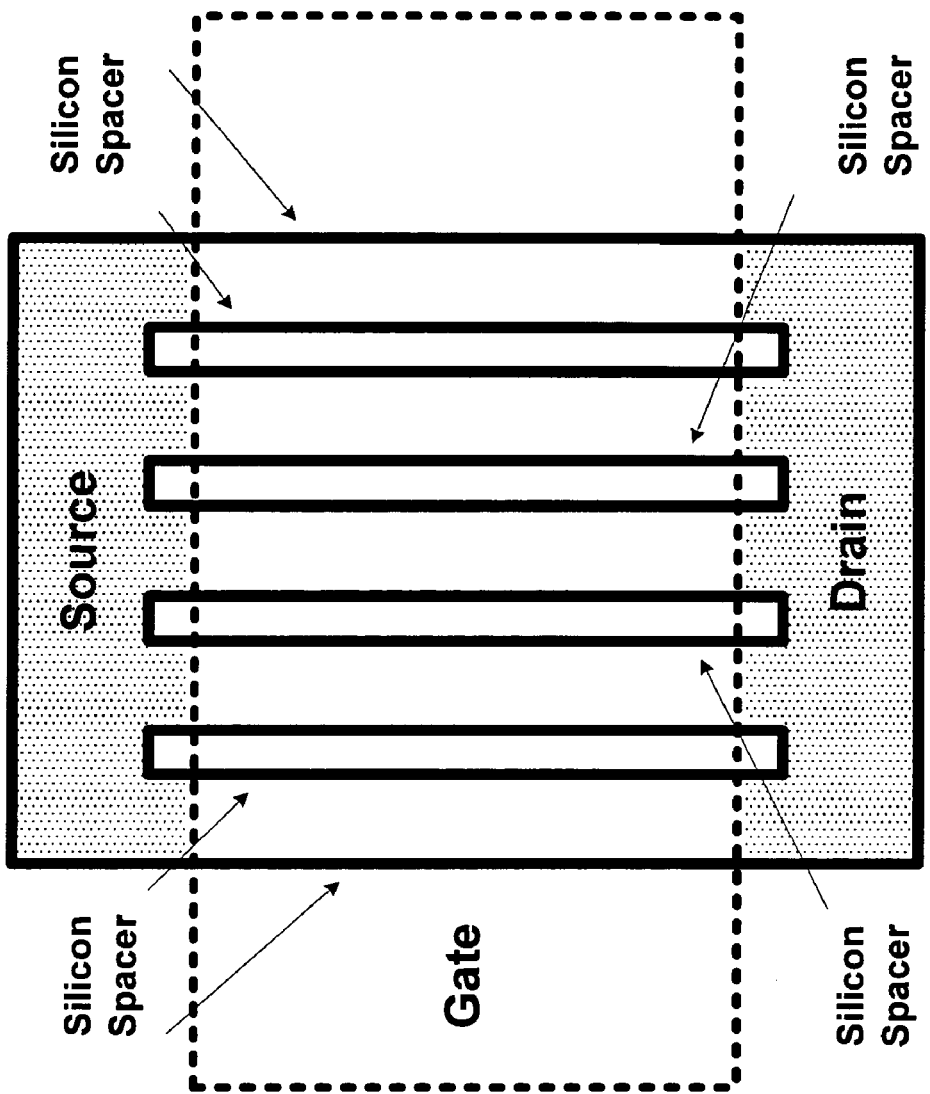
FIG. 7 is a view showing the way to overcome the self-heating effect of the transistor with bigger channel width according to the prior art.

Please refer to FIG. 5, which shows the distribution of the poly-Si grains in the channel obtained by the excimer laser recrystallization, and which also proves that larger silicon grains can be obtained in the channel of the transistor according to the present invention. The thinner area of the channel is totally melted while the thicker silicon spacer 7 is partially melted. The recrystallization at the inner side is triggered by the seed of silicon spacer 7 in the totally melted area. And, as shown in FIG. 5, there is no shrinkage on the rim of the active layer, which shows the shrinkage effect caused by the surface tension after the melting of all of the silicon film can be efficiently restrained according to the present invention. FIG. 6 shows the best status for the positions of the graphs on the active layer and the scan direction of the recrystallization done by a CW laser according to the present invention. Moreover, FIG. 7 shows a conventional way to overcome the self-heating effect. While transistors with bigger channel width W are obtained in this way together with the present invention, various current requirements can be met by parallel connections of several channels with smaller width $W_i$ so that bigger silicon grain can be kept in the channel and the self-heating effect can be solve at the same time.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method for fabrication of polycrystalline silicon thin film transistors, comprising the following steps of:
    a) obtaining a substrate;
    b) forming a buffer oxide on said substrate;
    c) depositing a first amorphous silicon on said buffer oxide;
    d) depositing a low-temperature oxide on said first amorphous silicon, wherein said low-temperature oxide is to be a stop layer for anisotropic plasma etching on a silicon film, a thermal insulating layer to prevent heat dissipation for laser annealing, and a hard mask for removing a silicon spacer after recrystallization;

e) by using a photoresist as a hard mask, etching said low-temperature oxide by way of anisotropic plasma etching and partially etching said first amorphous silicon; and f) after removing said photoresist, depositing a second amorphous silicon, wherein said second amorphous silicon is connected with said first amorphous silicon; forming a silicon spacer by way of anisotropic plasma etching; recrystallizing said second amorphous silicon by a continuous-wave laser or an excimer laser; and at the end, removing said silicon spacer and said low-temperature oxide on an active layer by way of anisotropic plasma etching.

2. The method according to claim 1, wherein said silicon spacer is made of a material selected from a group consisting of polycrystalline silicon and amorphous silicon.

3. The method according to claim 1, wherein by the way as described in said step f, said silicon spacer is formed on a rim of said active layer of SOI-MOSFET (silicon-on-insulator metal oxide semiconductor field effect transistor) on TFT (thin film transistor) and SOI (silicon-on-insulator).

4. The method according to claim 1, wherein after forming said silicon spacer on a rim of said active layer of TFT in said step f, said silicon spacer is applied with a laser recrystallization to obtain a temperature gradient for further recrystallization on the sides of said silicon film.

5. The method according to claim 1, further comprises wherein in said step f, said silicon spacer covered on the sidewall of said active layer of TFT is made of a material selected from a group consisting of dielectric materials and metal materials.

6. The method according to claim 5, wherein said dielectric materials are selected from the group consisting of oxide, nitride, and metal oxide.

7. The method according to claim 5, wherein said metal materials are selected from the group consisting of aluminum, wolfram, molybdenum and chromium.

8. The method according to claim 1, wherein said step f comprises recrystallizing said active layer by a method selected from the group consisting of excimer laser annealing, solid phase crystallization or metal-induced lateral crystallization; and forming a silicon spacer on a rim of said active layer of SOI-MOSFET on TFT and SOI.

* * * * *